(12) United States Patent
Lysinger (10) Patent No.: US 7,230,839 B2
(45) Date of Patent: Jun. 12, 2007

(54) MAGNITUDE CONTENT ADDRESSABLE MEMORY

(75) Inventor: Mark Alan Lysinger, Coppell, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 198 days.

(21) Appl. No.: 10/690,368

(22) Filed: Oct. 21, 2003

(65) Prior Publication Data

US 2005/0083718 A1 Apr. 21, 2005

(51) Int. Cl.
*G11C 15/00* (2006.01)
(52) U.S. Cl. .................. 365/49; 365/189.07; 711/108
(58) Field of Classification Search .................. 365/49, 365/189.07, 168; 711/108
See application file for complete search history.

(56) References Cited

U.S. PATENT DOCUMENTS

| 4,257,110 | A | | 3/1981 | Lamb et al. |
| 4,935,719 | A | | 6/1990 | McClure |
| 5,422,838 | A | * | 6/1995 | Lin ............................. 365/49 |
| 5,630,160 | A | | 5/1997 | Simpson et al. |
| 5,995,401 | A | * | 11/1999 | Schultz et al. ................. 365/49 |
| 6,373,739 | B1 | | 4/2002 | Lien et al. |
| 6,665,202 | B2 | * | 12/2003 | Lindahl et al. ................ 365/49 |
| 6,987,683 | B2 | * | 1/2006 | Ao ............................... 365/49 |
| 2004/0233692 | A1 | * | 11/2004 | Ao ............................... 365/49 |

FOREIGN PATENT DOCUMENTS

WO WO 02/49038 A1 6/2002

OTHER PUBLICATIONS

Jalaleddine S M S et al: "Associative IC Memories with Relational Search and Nearest-Match Capabilities" IEE Journal of Solid-State Circuits, IEEE Inc. New York, US, vol. 27, No. 6, Jun. 1, 1992, pp. 892-900, XP000306390, ISSN: 0018-9200.

* cited by examiner

*Primary Examiner*—David Lam
(74) *Attorney, Agent, or Firm*—Lisa K. Jorgenson; Renee' Michelle Leveque (57) ABSTRACT

A method and apparatus for comparing a stored data word to a comparison data word in a magnitude content addressable memory (MCAM). The magnitude comparator receives the data value and a comparison value as inputs, and produces two magnitude signals as outputs. The first magnitude signal indicates whether the comparison value is greater than the data value and the second magnitude signal indicates whether the comparison value is less than the data value. The magnitude comparator also receives magnitude signals from the preceding MCAM cell. The previous magnitude signals are output as the first and second magnitude signals when the data value and the comparison value are equal. The MCAM enables data words of arbitrary length to be compared with comparison words.

33 Claims, 5 Drawing Sheets

MAGNITUDE CONTENT ADDRESSABLE MEMORY

FIELD OF THE INVENTION

This invention relates generally to the field of computer memory. More particularly, this invention relates to a content addressable memory (CAM) for determining if a comparison value is greater than or less than a stored value.

BACKGROUND

Conventional random access memory (RAM) arrays have a number of memory cells arranged in rows and columns and include addressing circuitry that addresses a selected row of memory cells. The address of a memory cell corresponds to a physical location of the cell in the memory array. In order to determine if a particular data value is stored on memory, each memory location must be searched. In the course of the search, an address is supplied to the memory and the memory returns the data value stored at that address.

In contrast, in a content addressable memory (CAM), data values are addressed by their content rather than by a physical memory location. In order to determine if a particular data value is stored in the memory, the data value (the comparison value) is supplied to the memory and the rows of the CAM assert or de-assert an associated match signal depending on whether or not the comparison value matches one or more data values stored in the CAM cell row. Optionally, additional data associated with the matched value can be output.

CAM devices are valuable in providing associative look-up based on the contents of the data. A CAM may be preloaded with a pre-defined data set including data to be compared (keys) and, optionally, data to be output when a match is found. The address where the match is found can be used as an index to a secondary memory or other device. For example, CAM devices are used for address look-up functions in Internet data routing. The Internet address is used as the comparison value or key, and is associated with routing information. In another application, image data may be stored using pixel color as the key, thereby allowing pixel data stored in memory to be searched for pixels of a particular color.

Each memory cell of a binary CAM device stores the values 0 and 1, while ternary devices store the values 1, 0 and 'don't care'. The 'don't care' value will match with either a one or a zero. In either case, the output match value is a binary 0 or 1. Ternary CAM devices provide the ability to match variable length words to stored values. A bit in the word can be masked globally or individually.

New requirements in the field of networking are not satisfied by a simple match of a stored word and comparison word. For example, it may be necessary to compare ranges of values. Using present memory devices, multiple comparisons must be made to determine matches within a range.

SUMMARY

The present invention relates generally to content addressable memory devices. Objects and features of the invention will become apparent to those of ordinary skill in the art upon consideration of the following detailed description of the invention.

In one embodiment of the invention a magnitude content addressable memory (Magnitude CAM or MCAM) is provided that determines whether a comparison word is 'greater than' or 'less than' a stored value. As a by-product, a perfect match may also be determined. The width of the stored and comparison words is limited only by physical area and the speed requirements of the comparison.

BRIEF DESCRIPTION OF THE DRAWINGS

The novel features believed characteristic of the invention are set forth in the appended claims. The invention itself, however, as well as the preferred mode of use, and further objects and advantages thereof, will best be understood by reference to the following detailed description of an illustrative embodiment when read in conjunction with the accompanying drawing(s), wherein:

DETAILED DESCRIPTION

While this invention is susceptible of embodiment in many different forms, there is shown in the drawings and will herein be described in detail one or more specific embodiments, with the understanding that the present disclosure is to be considered as exemplary of the principles of the invention and not intended to limit the invention to the specific embodiments shown and described. In the description below, like reference numerals are used to describe the same, similar or corresponding parts in the several Views of the drawings.

Figure 1:
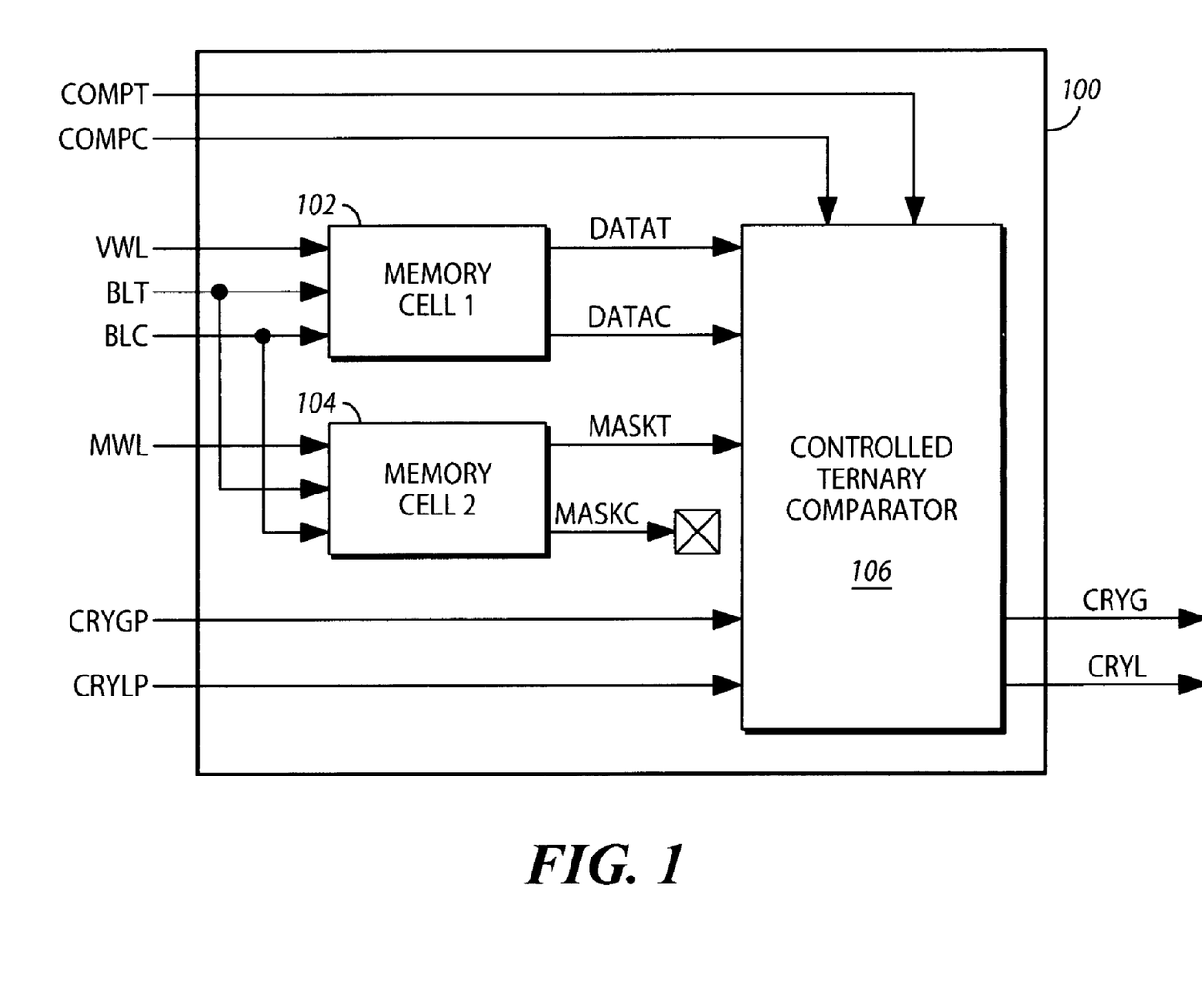
FIG. 1 is a diagrammatic representation of ternary CAM cell in accordance with certain aspects of the present invention.

FIG. 1 is a diagrammatic representation of a magnitude content addressable memory (Magnitude CAM or MCAM) in accordance with the present invention. The cell determines whether a comparison word is 'greater than' or 'less than' a stored value. As a by-product, a perfect match may also be determined. The width of the stored and comparison words is limited only by physical area and the speed requirements of the comparison. The cell may require more transistors than a standard ternary CAM (TCAM) cell and consequently may by larger. However, the increase in cell area is compensated by the increased capability of the magnitude CAM. FIG. 1 shows the basic circuitry for a single MCAM cell. The first stage contains two memory cells, 102 and 104. These may be SRAM cells for example, but any storage device could be used. FIG. 1 shows a ternary version of the cell having two memory cells 102 and 104. However, if individual bit masking is not required the second memory cell, 104, may be omitted, thereby reducing the number of transistors required. The inputs for these cells are typical for SRAM cells, having a word line running horizontally across each row and bit lines running vertically from row to row of the MCAM. In FIG. 1, the data memory cell 102 is used to store a data value and is controlled by word line VWL. Data to be written to the cell is carried in bit lines BLT and BLC, which denote the true bit value (T)

and its complement (C). Similarly, the mask memory cell 104 is used to store a mask value and is controlled by word line MWL. Data to be written to the cell is carried in the same bit lines BLT and BLC, which denote the true bit value (T) and complement (C) of the mask. An SRAM cell has two internal nodes, corresponding to the true and complementary values of the stored datum. The internal nodes values of the data memory cell 102 are output on lines DATAT and DATAC, which denote the true and complementary values, respectively. The internal node values of the mask memory cell 104 are output on lines MASKT and MASKC, denoting the true and complementary values, respectively. The DATAT, DATAC and MASKT lines are used by the next stage of the cell. Other types of memory cells may provide only the true values as outputs, in which case the DATAC signal may be generated by passing the DATAT signal through an inverter.

The DATAT, DATAC and MASKT lines are passed to a controlled magnitude comparator 106. The magnitude comparator also receives signals denoting the true and complementary values of the comparison bit (COMPT and COMPC respectively). If the MASKT signal is not asserted (i.e. it is a logical 0) the magnitude comparator compares the DATAT and COMPT values to determine which is larger. The operation of the controlled magnitude comparator is discussed in more detail below with reference to FIG. 2. If the mask memory cell is omitted, the magnitude comparator is not controlled by the mask signal and the magnitude comparator compares the COMPT and DATAT signals to determine which is larger.

Figure 2:
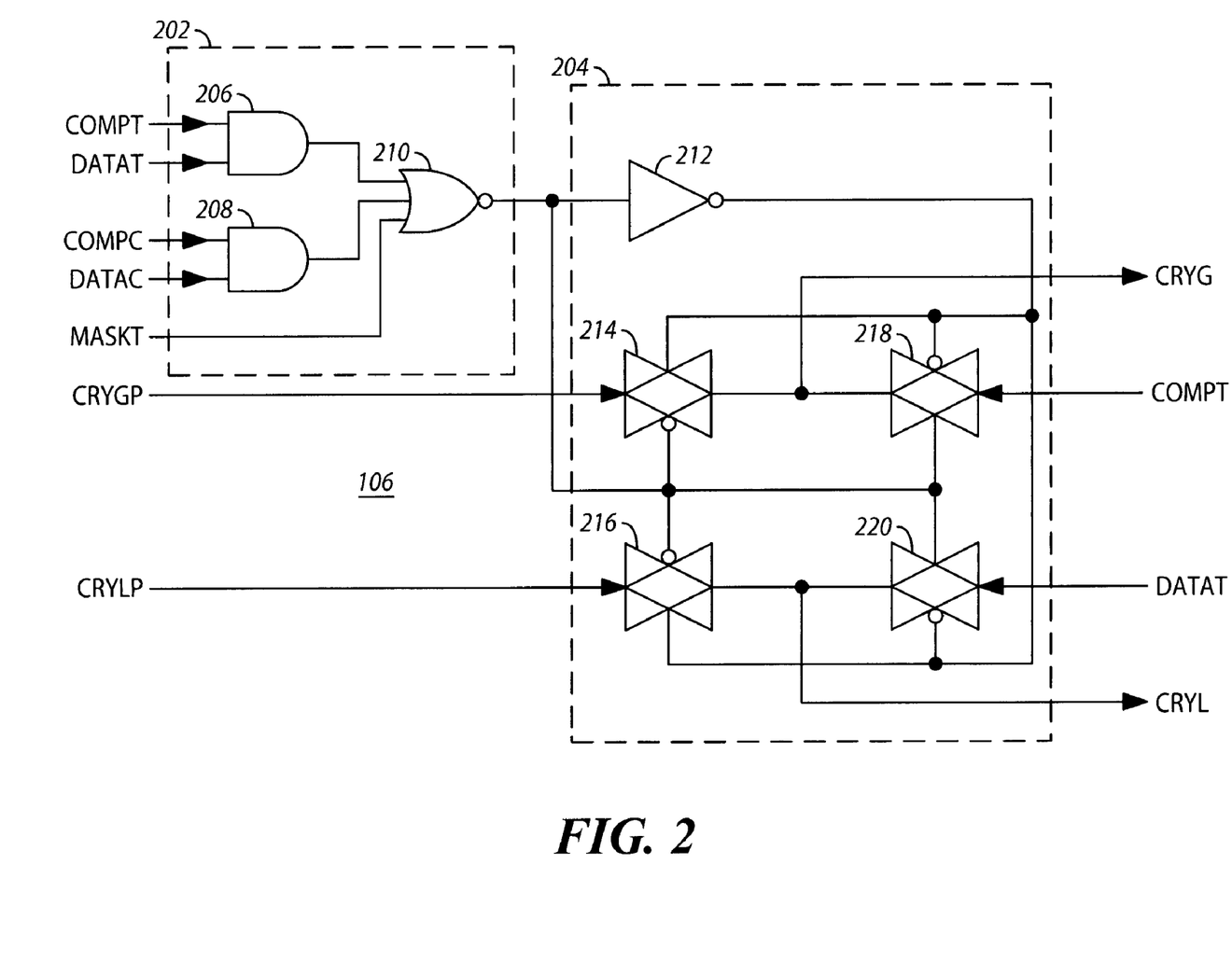
FIG. 2 is a diagrammatic representation of an exemplary controlled comparator in accordance with certain aspects of the present invention.

FIG. 2 shows an exemplary controlled magnitude comparator 106. The first stage 202 of the comparator is a controlled XOR gate. The function of this gate is to determine if the two sets of inputs are the same. The circuit shown is a CMOS gate, but could be any gate that performs the XOR function. The inputs are the compare lines COMPT and COMPC, which run vertically from row to row of the MCAM cells and the internal nodes (DATAT and DATAC) of the data memory cell. The comparison value COMPT and the stored data value DATAT are passed to AND gate 206, while the complementary signals COMPC and the stored data value DATAC are passed to AND gate 208. The outputs from AND gate 206 and AND gate 208 are passed to NOR gate 212. If the ternary bit mask MASKT is used and asserted, the output of the gate is forced into a low state, which is effectively a bypass state for the carry signals. The function of the first stage 202 is to produce a match signal and its complement. The stage could be implemented using other combinations of logic elements. For example, and XNOR gate followed by a NOR gate could be used.

The next stage, 204 in FIG. 2, is a series of CMOS transmission gates and an inverter 212 that form a magnitude comparator. The gates 214 and 218 perform the 'greater than' function while the gates 216 and 220 perform the 'less than' function. The output from the NOR gate 210 is supplied to one side of each gate while its complement, the output from the inverter 212 is supplied to the other side of the gate. Other types of signal gates could be used, however the use of transmission gates that employ both P-channel and N-channel transistors avoids signal degradation. This is beneficial since the MCAM cells may be cascaded in series in a row of the MCAM device. This form of magnitude comparator is known in the art. Previous carry signals CRYGP and CRYLP are passed to the magnitude comparator from the preceding MCAM cell in the row. The carry signals, also called magnitude signals, denote whether the comparison value is greater than the data value and whether the comparison value is less than the data value. Together, the magnitude signals also indicate if the comparison and data values are equal. The inputs to the first cell of a row may be grounded to represent a logical zero. The previous carry signals denote the results of comparing data bits having a lower significance. Depending upon the result of the XNOR gate, either the previous carry signals or the new data are passed on as the new carry or magnitude signals CRYG and CRYL. For example, if the COMPT and DATAT values match in this bit position, the previous carry signals CRYGP and CRYLP are passed because the comparison has not changed and still determined by the lower bits. However, if the COMPT and DATAT values do not match in the current bit position, the current bit of COMPT is passed as CRYG (i.e. if COMPT=1 and DATAT=0, then COMPT is greater than DATAT and vice versa). Similarly, the current bit of DATAT is passed as CRYL (i.e. if COMPT=0 and DATAT=1, then COMPT is less than DATAT and vice versa). This process is continued for each subsequent bit until the most significant bits have compared. If the mask bit is set, the output of the NOR gate 210 is pulled low and the previous carry signals are passed.

Figure 3:
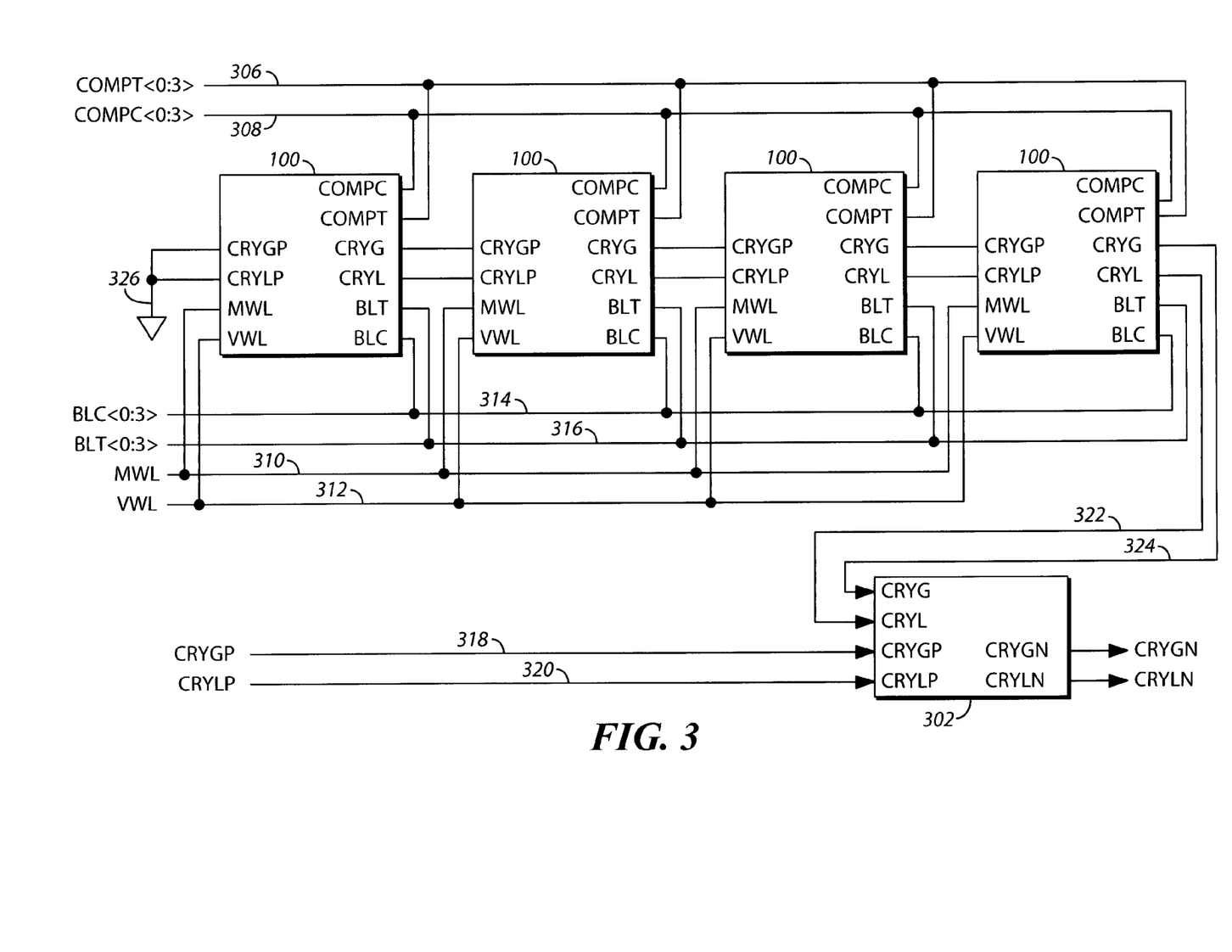
FIG. 3 is a diagrammatic representation of a group of four ternary CAM cells in accordance with certain aspects of the present invention.

FIG. 3 is a diagrammatic representation of a row of four ternary MCAM cells 100 in accordance with certain aspects of the present invention. In practice, any number of MCAM cells may be configured a row, allowing comparison of words of various lengths. The left most cell stores the least significant bit of the data word. The carry outputs CRYG and CRYL of each MCAM cell are connected to the previous carry inputs (CRYGP and CRYLP) of the subsequent MCAM cell. The CRYGP and CRYLP inputs of the leftmost cell are grounded at ground connection 326. Word input lines 310 and 312 are connected to each MCAM cell. The signal MWL is asserted on line 310 to enable data to be written to the mask memory of each cell, while the signal VWL is asserted on line 312 to enable data to be written to the data memory of each cell. In either case, the data itself is supplied on bit line inputs 314 that may be arrayed in typical SRAM fashion. In this case the signal BLT<0:3> specifies the four bits to be written, with one bit being written to each MCAM cell. The least significant bit is written to the leftmost cell. An optional additional bit line 316 carries complementary data BLC<0:3> to be written to the memory cells. This line is required for example when SRAM cells are used since they have two internal nodes. The comparison inputs 306 and 308 are also arrayed. The signal COMPT<0:3> comprises four bits, each of which is supplied to one of the four MCAM cells. In this example, complementary comparison values COMPC<0:3> are also supplied to the MCAM cells.

The magnitude or carry outputs 322 (CRYG) and 324 (CRYL) from the right most MCAM cell (which compares the most significant bits of the data value and the comparison value) are passed to a second stage comparator 302, along with outputs 318 (CRYGP) and 320 (CRYLP) from previous stages. The outputs from the second stage comparator 302, denoted as CRYGN and CRYLN are passed to the next stage. The operation of the second stage comparator 302 will be discussed below in reference to FIG. 4.

Table 1 below is a truth table for the positive logic signals in an MCAM cell.

TABLE 1

| INPUTS | | | OUTPUTS | |
|---|---|---|---|---|
| DATAT | COMPT | CRYP | CRYG | CRYL |
| 0 | 0 | 0 | 0 | 0 |
| 0 | 0 | 1 | 1 | 1 |
| 0 | 1 | 0 | 1 | 0 |
| 0 | 1 | 1 | 1 | 0 |
| 1 | 0 | 0 | 0 | 1 |
| 1 | 0 | 1 | 0 | 1 |
| 1 | 1 | 0 | 0 | 0 |
| 1 | 1 | 1 | 1 | 1 |

In the table, the input CRYP is taken to denote CRYGP when considering CRYG (since CRYG does not depend upon CRYLP) and taken to denote CRYLP when considering CRYL. Note that whenever DATAT and COMPT are equal, the CRYP value is passed as CRYG or CRYL. If DATAT and COMPT are unequal, COMPT is passed as CRYG and DATAT is passed as CRYL.

An example computation is shown in TABLE 2 below.

TABLE 2

| | | | CELL NUMBER | | | |
|---|---|---|---|---|---|---|
| | | | 4 | 3 | 2 | 1 |
| INPUTS | DATAT | 5 | 0 | 1 | 0 | 1 |
| | COMPT | 10 | 1 | 0 | 1 | 0 |
| | CRYGP | | 0 | 1 | 0 | 0 |
| | CRYLP | | 1 | 0 | 1 | 0 |
| OUTPUTS | CRYG | | 1 | 0 | 1 | 0 |
| | CRYL | | 0 | 1 | 0 | 1 |

The computation proceeds from cell 1 to cell 4. CRYGP and CRYLP are initialized at cell 1 to zero. The outputs from cell 4 are CRYG=1 and CRYL=0, indicating that COMPT is greater than DATAT. The computation proceeds as follows:

1. The DATAT value is 5 decimal or 0101 binary. The COMPT is 10 decimal or 1010 binary.
2. Starting at the rightmost column or least significant bit, the input is 100, where the 1 is the least significant bit DATAT, the next zero is the least significant bit of COMPT and the last zero is the least significant bit of CRYGP or CRYLP.
3. Using the input 100 in TABLE 1, gives CRYG=0 and CRYL=1 for cell 1 (the MCAM cell for the least significant bit).
4. The output values for CRYG and CRYL are coupled to the MCAM cell for the next bit, as shown in FIG. 3.
5. The next inputs for the truth table are 010 producing a 1 at CRYG and 011 producing a zero at CRYL. These outputs are passed to the MCAM cell for the next bit.
6. The next inputs for the truth table are 101 producing a 0 at CRYG and 100 producing a 1 at CRYL. These outputs are passed to the MCAM cell for the next bit.
7. The final most significant bit inputs are 010 producing a 1 at CRYG and 011 producing a 0 at CRYL. This indicates that COMPT is greater than DATAT.

A further example computation is shown in TABLE 3 below.

TABLE 3

| | | | CELL NUMBER | | | |
|---|---|---|---|---|---|---|
| | | | 4 | 3 | 2 | 1 |
| INPUTS | DATAT | 12 | 1 | 1 | 0 | 0 |
| | COMPT | 7 | 0 | 1 | 1 | 1 |
| | CRYGP | | 1 | 1 | 1 | 0 |
| | CRYLP | | 0 | 0 | 0 | 0 |
| OUTPUTS | CRYG | | 0 | 1 | 1 | 1 |
| | CRYL | | 1 | 0 | 0 | 0 |

The outputs from cell 4 are CRYG=0 and CRYL=1, indicating that COMPT is less than DATAT.

A further example computation is shown in TABLE 4 below.

TABLE 4

| | | | CELL NUMBER | | | |
|---|---|---|---|---|---|---|
| | | | 4 | 3 | 2 | 1 |
| INPUTS | DATAT | 7 | 0 | 1 | 1 | 1 |
| | COMPT | 12 | 1 | 1 | 0 | 0 |
| | CRYGP | | 0 | 0 | 0 | 0 |
| | CRYLP | | 1 | 1 | 1 | 0 |
| OUTPUTS | CRYG | | 1 | 0 | 0 | 0 |
| | CRYL | | 0 | 1 | 1 | 1 |

The outputs from cell 4 are CRYG=1 and CRYL=0, indicating that COMPT is greater than DATAT.

A still further example computation is shown in TABLE 5 below.

TABLE 5

| | | | CELL NUMBER | | | |
|---|---|---|---|---|---|---|
| | | | 4 | 3 | 2 | 1 |
| INPUTS | DATAT | 15 | 1 | 1 | 1 | 1 |
| | COMPT | 15 | 1 | 1 | 1 | 1 |
| | CRYGP | | 0 | 0 | 0 | 0 |
| | CRYLP | | 0 | 0 | 0 | 0 |
| OUTPUTS | CRYG | | 0 | 0 | 0 | 0 |
| | CRYL | | 0 | 0 | 0 | 0 |

The outputs from cell 4 are CRYG=0 and CRYL=0, indicating that COMPT is neither greater than DATAT nor less than DATAT, that is: COMPT=DATAT. A simple NOR gate having CRYG and CRYL as inputs would produce a match or equality signal.

The MCAM device of the present invention, or a part of it, may be implemented using positive or negative logic.

The number of MCAM cells may be chosen to produce any word length. When long word lengths are required, it may be necessary to use inverter buffers or other devices to boost the CRYG and CRYL signals. In a test configuration of four MCAM cells the signal degradation was not severe enough to require buffering to boost the signals. If more cells are added then using inverter buffers or other booster buffers between CRYG and CRYGP will improve performance. The same is true for CRYL and CRYLP. The buffers may be used between every cell, every other cell or wherever needed to achieve a required performance.

When an inverter buffer is used between cells, the subsequent cell should use negative logic inputs relative to the preceding cell to control the transfer gates (204 in FIG. 2). For example, if the transfer gates 204 of the cell prior to the inverter used the signals COMPT and DATAT the subsequent gate should use the signals COMPC and DATAC.

Figure 4:
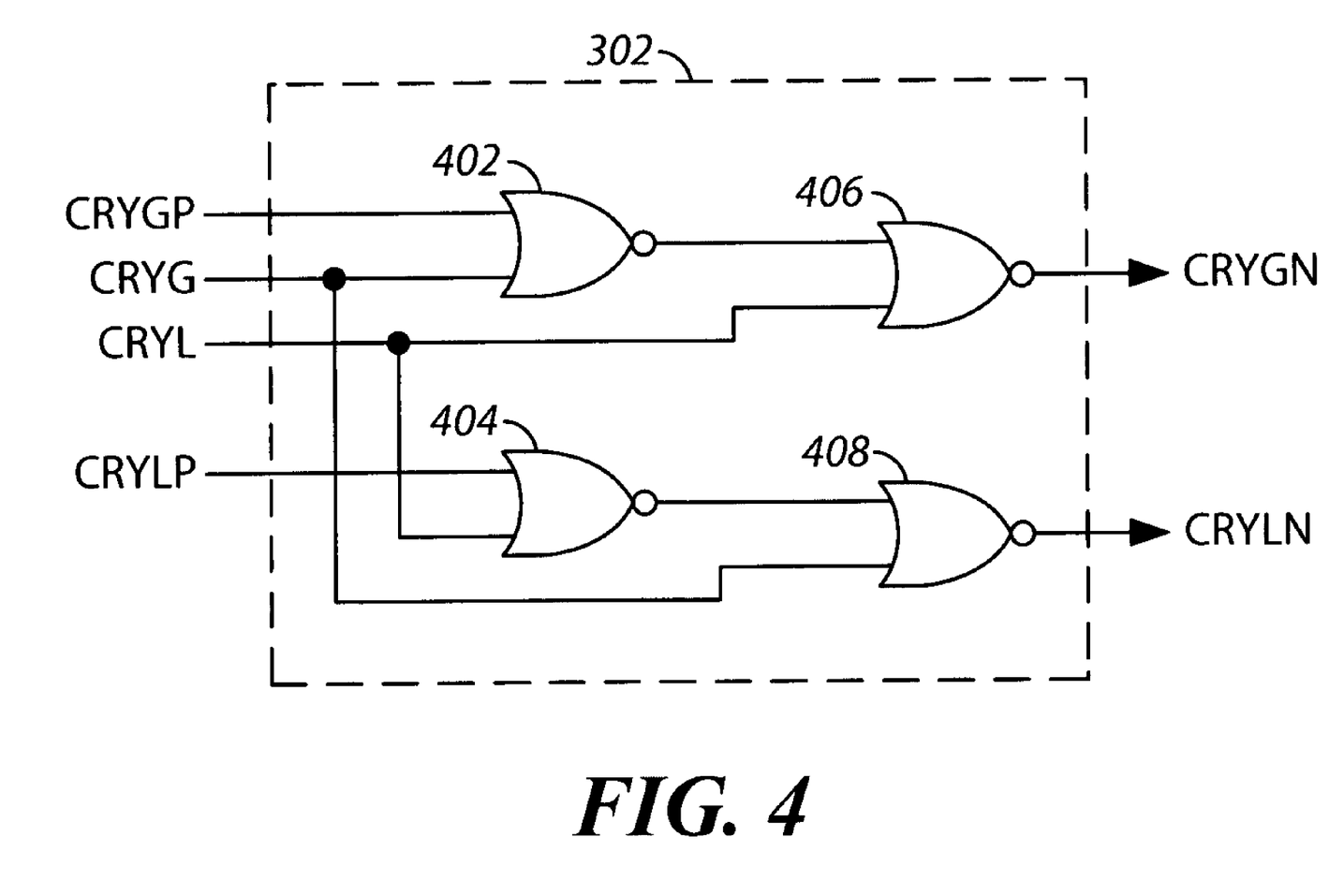
FIG. 4 is a diagrammatic representation of an exemplary second stage comparator in accordance with certain aspects of the present invention.

Another way to improve performance for long words is to use groups of cells in parallel together with a second stage comparator. A second stage comparator 302 coupled to a group of MCAM cells is shown in FIG. 3. An exemplary embodiment of a second stage comparator 302 is shown in FIG. 4. Referring to FIG. 4, the second stage comparator 302 comprises a group of NOR gates which tie together the outputs of MCAM groups. The output CRYG from the current MCAM group is passed to NOR gate 402 together with the carry signal CRYGP from the previous MCAM group. The output CRYL from the current MCAM group is passed to NOR gate 404 together with the carry signal CRYLP from the previous MCAM group. The output from NOR gate 402 is passed to NOR gate 406 together with the carry signal CRYL from the current MCAM group. This produces the 'greater than' signal CRYGN for the next MCAM group. The output from NOR gate 404 is passed to NOR gate 408 together with the carry signal CRYG from the current MCAM group. This produces the 'less than' signal CRYLN for the next MCAM group. The second stage comparator may of course be implemented using equivalent logic circuits. For example, negative logic may be used, substituting NAND gates for the NOR gates.

The second stage comparator 302 is employed as shown in FIG. 3. The addition of this circuit allows the four cell MCAM group to be used with other MCAM groups to allow comparison of words of arbitrary length. For very long words, additional stages using the same second stage comparator would allow more parallelism. Any size group may be used and any number of groups and stages may be used. The final output of the arrangement will provide the magnitude result. The truth table for the CRYGN signal is:

TABLE 6

| INPUTS | | | OUTPUT |
|---|---|---|---|
| CRYG | CRYGP | CRYL | CRYGN |
| 0 | 0 | 0 | 0 |
| 0 | 1 | 0 | 1 |
| 0 | 0 | 1 | 0 |
| 0 | 1 | 1 | 0 |
| 1 | 0 | 0 | 1 |
| 1 | 1 | 0 | 1 |
| 1 | 0 | 1 | 0 |
| 1 | 1 | 1 | 0 |

CRYGN is zero if the current CRYL is set, since the current bit has a higher significance, otherwise CRYGN is one if either CRYG or CRYGP is set and CRYGN is zero if both CRYG and CRYGP are zero. The truth table for the CRYLN signal is:

TABLE 7

| INPUTS | | | OUTPUT |
|---|---|---|---|
| CRYL | CRYLP | CRYG | CRYLN |
| 0 | 0 | 0 | 0 |
| 0 | 1 | 0 | 1 |
| 0 | 0 | 1 | 0 |
| 0 | 1 | 1 | 0 |
| 1 | 0 | 0 | 1 |
| 1 | 1 | 0 | 1 |
| 1 | 0 | 1 | 0 |
| 1 | 1 | 1 | 0 |

Figure 5:
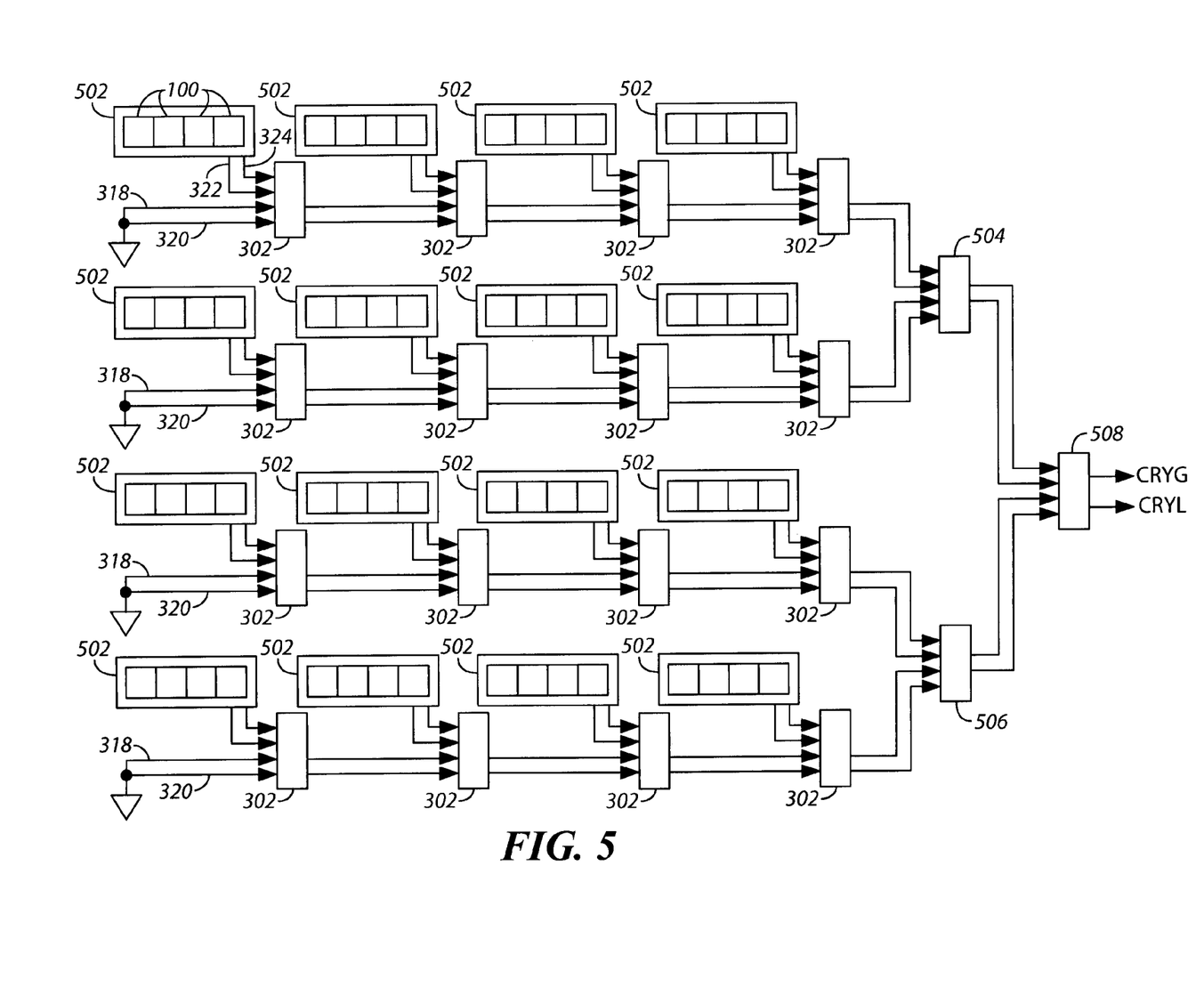
FIG. 5 is a diagrammatic representation of an exemplary 64-bit MCAM device, in accordance with certain aspects of the present invention.

An example arrangement of a 64-bit MCAM device is shown in FIG. 5. Each MCAM call group 502 is made up of four MCAM cells. Each row of the array is made up of four MCAM groups, coupled together using second stage comparators 302. Each comparator has the outputs 322 and 324 of the MCAM group as inputs, together with the signals from the previous second stage comparator. The inputs 318 and 320 to the first comparator are grounded. In the arrangement in FIG. 5, there are four rows of MCAM groups. The outputs of the first and second rows are combined at second stage comparator 504, while the outputs of the third and fourth rows are combined at second stage comparator 506. The outputs of comparators 504 and 506 are combined at second stage comparator 508 to provide the final output signals, CRYG and CRYL. In operation, the data value is loaded by rows, starting with the least significant bit in the bottom left hand corner of the array. Hence, the 16 least significant bits of the data value is loaded in the cells in the bottom row of the array, with the least significant bit being loaded in bottom left hand corner. The next 16 least significant bits are loaded into the second row from the bottom of the array, the next 16 into the third row and the most significant 16 bits are loaded into the top row. The most significant bit is stored in the top right cell. Other configurations using combinations of series and parallel connections will be apparent to those of ordinary skill in the art.

While the invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims.

What is claimed is:

1. A magnitude content addressable memory (MCAM) comprising a plurality of MCAM cells, wherein a cell of the plurality of MCAM cells comprises:
    a first memory cell for storing a data value; and
    a magnitude comparator coupled to the first memory cell and operable to receive a comparison value and the data value as inputs to produce first and second magnitude signals as outputs;
wherein the first magnitude signal indicates if the comparison value is greater than the data value and the second magnitude signal indicates if the comparison value is less than the data value and wherein the magnitude comparator is further responsive to a previous first magnitude signal and a previous second magnitude signal output from â previous MCAM cell and wherein the previous first magnitude signal is output as the first magnitude signal and the previous second magnitude signal is output as the second magnitude signal when the data value and the comparison values are equal.

2. A content addressable memory in accordance with claim 1, wherein the MCAM cell further comprises a second memory cell for storing a mask bit and wherein the magnitude comparator is controlled by the mask value to pass the previous first magnitude signal as the first magnitude signal and the previous second magnitude signal as the second magnitude signal when the mask bit has a predetermined value.

3. A content addressable memory in accordance with claim 1, wherein the magnitude comparator comprises:
a first logic circuit producing as output a match signal indicative of whether or not the data value and the comparison value match; and
a second logic circuit, responsive to the match signal, the previous first magnitude signal and the previous second magnitude signal and producing the first and second magnitude signals as output.

4. A content addressable memory in accordance with claim 3, wherein the first logic circuit comprises:
a first AND gate having the data value and the comparison values as inputs;
a second AND gate having the complement of the data value and the complement of the comparison values as inputs; and
a NOR gate having the output of the first and second AND gate as inputs and producing the match value as output.

5. A content addressable memory in accordance with claim 4, further comprising a second memory cell for storing a mask value, wherein the NOR gate is a controlled NOR gate controlled by mask value.

6. A content addressable memory in accordance with claim 3, wherein the second logic circuit comprises:
a first transmission gate controlled by the match signal and operable to pass the first previous magnitude signal as the first magnitude signal when the data value and comparison values match;
a second transmission gate controlled by the match signal and operable to pass the second previous magnitude signal as the second magnitude signal when the data value and comparison values match;
a third transmission gate controlled by the match signal and operable to pass the comparison value as the first magnitude signal when the data value and comparison values do not match; and
a fourth transmission gate controlled by the match signal and operable to pass the data value as the second magnitude signal when the data value and comparison values do not match.

7. A content addressable memory in accordance with claim 6, wherein at least one of the first, second, third and fourth transmission gates comprises a p-channel transistor and an n-channel transistor and is controlled by the match signal and it complement.

8. A content addressable memory in accordance with claim 1, wherein the plurality of MCAM cells are configured as at least one MCAM cell group having a series arrangement, and wherein the comparator of an MCAM cell in the at least one group is responsive to the first and second magnitude signals of a preceding MCAM cell in the series arrangement.

9. A content addressable memory in accordance with claim 8, wherein the first MCAM cell of an MCAM group is operable to store the least significant bit of a data word and last MCAM cell of the MCAM group is operable to store the most significant word of the data word.

10. A content addressable memory in accordance with claim 8, wherein the plurality of MCAM cells are configured as an arrangement of at least two MCAM cell groups and further comprising:
a second stage comparator responsive to the first and second magnitude signal of the last cell in a first MCAM cell group and responsive to the first and second magnitude signal of the last cell in a second MCAM cell group and operable to produce first and second magnitude signals.

11. A content addressable memory in accordance with claim 10, wherein the plurality of MCAM cells are configured as an array of at least two MCAM cell groups, each row of the array being a series arrangement of MCAM groups connected by second stage comparators and the rows being connected in parallel by second stage comparators.

12. A content addressable memory in accordance with claim 10, wherein the second stage comparator comprises:
a first NOR gate responsive to the first magnitude signal of the first MCAM cell group and the first magnitude signal of the second MCAM cell group to produce a first comparison signal;
a second NOR gate responsive to the second magnitude signal of the first MCAM cell group and the second magnitude signal of the second MCAM cell group to produce a second comparison signal;
a third NOR gate responsive to the second magnitude signal of the first MCAM cell group and the first comparison signal to produce a first output magnitude signal; and
a fourth NOR gate responsive to the first magnitude signal of the first MCAM cell group and the second comparison signal to produce a second output magnitude signal.

13. A content addressable memory in accordance with claim 8, further comprising a signal booster, operable to boost the level at a first or second magnitude signal and thereby avoid signal degradation.

14. A content addressable memory in accordance with claim 1 wherein the first memory is an SRAM.

15. A content addressable memory in accordance with claim 14, further comprising:
a write line coupled to the SRAM;
a first bit line coupled to the SRAM for carrying a true data signal to be stored in the SRAM; and
a second bit line coupled to the SRAM for carrying a complementary data signal to be stored in the SRAM.

16. A content addressable memory comprising:
at least one group of MCAM cells, each MCAM cell comprising a data memory for storing a bit of a data word and a magnitude comparator for comparing the bit of the data word to a corresponding bit of a comparison word;
a word line for the group of MCAM cells;
a plurality of data bit lines, one for each MCAM cell in the group of MCAM cells, for supplying bits of the data word to the MCAM cells;
a plurality of comparison bit lines, one for each MCAM cell in the group of MCAM cells, for supplying bits of the comparison word to the MCAM cells,
wherein the magnitude comparators of the MCAM cells are connected in a series arrangement and are operable to produce a first magnitude signal indicating whether the comparison word is greater than the data word and a second magnitude signal indicating whether the comparison word is less than the data word and wherein each MCAM cell further comprises mask memory for storing a mask value and wherein the magnitude comparator is a controlled magnitude comparator controlled by the mask value.

17. A content addressable memory in accordance with claim 16, wherein the at least one group of MCAM cells include a first MCAM cell group for storing a first sub-word of the data word and a second MCAM cell group for storing a second sub-word of the data word and further comprising a second stage comparator, responsive to the first and second magnitude signals and the first MCAM cell group and the first and second magnitude signals and the second MCAM cell group.

18. A content addressable memory in accordance with claim 17, wherein the second stage comparator comprises:
   a first NOR gate responsive to the first magnitude signal of the first MCAM cell group and the first magnitude signal of the second MCAM cell group to produce a first comparison signal;
   a second NOR gate responsive to the second magnitude signal of the first MCAM cell group and the second magnitude signal of the second MCAM cell group to produce a second comparison signal;
   a third NOR gate responsive to the second magnitude signal of the first MCAM cell group and the first comparison signal to produce a first output magnitude signal; and
   a fourth NOR gate responsive to the first magnitude signal of the first MCAM cell group and the second comparison signal to produce a second output magnitude signal.

19. A method of comparing a plurality of bits of a comparison word and a data word in a magnitude content addressable memory comprising a sequence of MCAM cells, the method comprising:
   storing each bit of the data word in a data memory of an MCAM cell of the sequence of MCAM cells, the least significant bit of the data word being stored in a first MCAM cell of the sequence of MCAM cells;
   supplying signals representing the least significant bit of the data word and a corresponding least significant bit of the comparison word to a comparator of the first MCAM cell to determine if the least significant bit of the comparison word is greater than or less than the least significant bit of the data word;
   outputting from the first MCAM cell a first magnitude signal indicating whether the least significant bit of the comparison word is greater than the least significant bit of the data word;
   outputting from the first MCAM cell a second magnitude signal indicating whether the least significant bit of the comparison word is less than the least significant bit of the data word; and
   for each subsequent bit of the plurality of bits, the subsequent bit of the data word being stored in a data memory of a current MCAM cell:
      supplying signals representing the bit of the data word and the corresponding bit of the comparison word to a logic circuit of the current MCAM cell to determine if the bit of the comparison word matches of the bit of the data word;
      if the bit of the comparison word matches the bit of the data word:
         outputting the first magnitude signal of the preceding MCAM cell as the first magnitude signal of the current MCAM cell;
         outputting the second magnitude signal of the preceding MCAM cell as the second magnitude signal of the current MCAM cell;
      otherwise:
         outputting the signal representing the comparison bit as the first magnitude signal of the current MCAM cell; and
         outputting the signal representing the data bit as the second magnitude signal of the current MCAM cell.

20. A method in accordance with claim 19, further comprising:
   storing a mask value in a mask memory of an MCAM cell; and
   if the mask value indicates that the associated data bit in the MCAM cell is to be masked:
      outputting the first magnitude signal of the preceding MCAM cell as the first magnitude signal of the current MCAM cell;
      outputting the second magnitude signal of the preceding MCAM cell as the second magnitude signal of the current MCAM cell.

21. A method in accordance with claim 19, wherein outputting the first magnitude signal of the preceding MCAM cell as the first magnitude signal of the current MCAM cell comprises:
   supplying the first magnitude signal of the preceding MCAM cell to the input of a transmission gate;
   supplying a match signal, indicative of whether the comparison word matches the bit of the data word to a first transistor of the transmission gate;
   supplying a complement of the match signal to a second transistor of the transmission gate; and
   outputting the output from the transmission gate.

22. A method in accordance with claim 19, wherein outputting the signal representing the comparison bit as the first magnitude signal of the current MCAM cell comprises:
   supplying the signal representing the comparison bit to the input of a transmission gate;
   supplying a match signal, indicative of whether the comparison word matches the bit of the data word to a first transistor of the transmission gate;
   supplying a complement of the match signal to a second transistor of the transmission gate; and
   outputting the output from the transmission gate.

23. A method in accordance with claim 19, wherein outputting the second magnitude signal of the preceding MCAM cell as the second magnitude signal of the current MCAM cell comprises:
   supplying the second magnitude signal of the preceding MCAM cell to the input of a transmission gate;
   supplying a match signal, indicative of whether the comparison word matches the bit of the data word to a first transistor of the transmission gate;
   supplying a complement of the match signal to a second transistor of the transmission gate; and
   outputting the output from the transmission gate.

24. A method in accordance with claim 19, wherein outputting the signal representing the data bit as the second magnitude signal of the current MCAM cell comprises:
   supplying the signal representing the data bit to the input of a transmission gate;
   supplying a match signal, indicative of whether the comparison word matches the bit of the data word to a first transistor of the transmission gate;
   supplying a complement of the match signal to a second transistor of the transmission gate; and
   outputting the output from the transmission gate.

25. A method in accordance with claim 19, wherein the first magnitude signal CRYG is computed in accordance the truth table:

| INPUTS | | | OUTPUTS |
|---|---|---|---|
| DATAT | COMPT | CRYGP | CRYG |
| 0 | 0 | 0 | 0 |
| 0 | 0 | 1 | 1 |
| 0 | 1 | 0 | 1 |
| 0 | 1 | 1 | 1 |
| 1 | 0 | 0 | 0 |
| 1 | 0 | 1 | 0 |
| 1 | 1 | 0 | 0 |
| 1 | 1 | 1 | 1 | and wherein the second magnitude signal CRYL is computed in accordance the truth table:

| INPUTS | | | OUTPUTS |
|---|---|---|---|
| DATAT | COMPT | CRYLP | CRYL |
| 0 | 0 | 0 | 0 |
| 0 | 0 | 1 | 1 |
| 0 | 1 | 0 | 0 |
| 0 | 1 | 1 | 0 |
| 1 | 0 | 0 | 1 |
| 1 | 0 | 1 | 1 |
| 1 | 1 | 0 | 0 |
| 1 | 1 | 1 | 1 | where DATAT is the data value, COMPT is the comparison value, CRYGP is the previous first magnitude signal and CRYLP is the previous second magnitude signal.

26. A method in accordance with claim 19, wherein the sequence of MCAM cells comprises a first group of MCAM cells and second group of MCAM cells, the method further comprising:
supplying the first and second magnitude signals of the last MCAM cell of the first group of MCAM cells to a second stage comparator;
supplying the first and second magnitude signals of the last MCAM cell of the second group of MCAM cells to a second stage comparator;
outputting a first magnitude signal from the second stage comparator, indicative of whether a data word stored in the first and second groups of MCAM cells is greater than the comparison word; and
outputting a second magnitude signal from the second stage comparator, indicative of whether the data word stored in the first and second groups of MCAM cells is less than the comparison word.

27. A method in accordance with claim 19, wherein the first magnitude signal CRYGN output from the second stage is computed in accordance the truth table:

| INPUTS | | | OUTPUT |
|---|---|---|---|
| CRYG | CRYGP | CRYL | CRYGN |
| 0 | 0 | 0 | 0 |
| 0 | 1 | 0 | 1 |
| 0 | 0 | 1 | 0 |
| 0 | 1 | 1 | 0 |
| 1 | 0 | 0 | 1 |
| 1 | 1 | 0 | 1 |
| 1 | 0 | 1 | 0 |
| 1 | 1 | 1 | 0 | and where the second magnitude signal CRYLN output from the second stage is computed in accordance the truth table:

| INPUTS | | | OUTPUT |
|---|---|---|---|
| CRYL | CRYLP | CRYG | CRYLN |
| 0 | 0 | 0 | 0 |
| 0 | 1 | 0 | 1 |
| 0 | 0 | 1 | 0 |
| 0 | 1 | 1 | 0 |
| 1 | 0 | 0 | 1 |
| 1 | 1 | 0 | 1 |
| 1 | 0 | 1 | 0 |
| 1 | 1 | 1 | 0 | where CRYGP is the first magnitude signal output from the first group of MCAM cells, CRYLP is the previous second magnitude signal output from the first group of MCAM cells, CRYG is the first magnitude signal output from the second group of MCAM cells and CRYL is the previous second magnitude signal output from the second group of MCAM cells.

28. A method in accordance with claim 19, further comprising boosting the first and second magnitude signals between adjacent groups of MCAM cells.

29. A magnitude content addressable memory (MCAM) comprising a plurality of MCAM cells, wherein a cell of the plurality of MCAM cells comprises:
a first memory cell for storing a data value; and
comparison means, coupled to the first memory cell and operable to receive a comparison value and the data value as inputs, for generating first and second magnitude signals as outputs;
wherein the first magnitude signal indicates if the comparison value is greater than the data value and the second magnitude signal indicates if the comparison value is less than the data value and wherein the comparison means is further responsive to a previous first magnitude signal and a previous second magnitude signal output from a previous MCAM cell and wherein the previous first magnitude signal is output as the first magnitude signal and the previous second magnitude signal is output as the second magnitude signal when the data value and the comparison values are equal.

30. A content addressable memory in accordance with claim 29, wherein the MCAM cell further comprises a second memory cell for storing a mask bit and wherein the comparison means is controlled by the mask value to pass the previous first magnitude signal as the first magnitude signal and the previous second magnitude signal as the second magnitude signal when the mask bit has a predetermined value.

31. A magnitude content addressable memory (MCAM) comprising a plurality of MCAM cells, wherein a first cell of the plurality of MCAM cells comprises:
- a memory cell for storing a data value; and
- a magnitude comparator coupled to the first memory cell and operable to generate an output magnitude signal dependent upon a comparison value, the data value and a previous magnitude signal, wherein the previous magnitude signal is generated by a second cell of the plurality of MCAM cells and wherein the output magnitude signal is asserted if the comparison value is greater than the data value or if the comparison value is equal to the data value and the previous magnitude signal is asserted.

32. A magnitude content addressable memory (MCAM) in accordance with claim 31, wherein the plurality of MCAM cells are arranged in series.

33. A content addressable memory comprising:
- at least one group of MCAM cells, each MCAM cell comprising a data memory for storing a bit of a data word, a magnitude comparator operable to generate an output magnitude signal in response to the bit of the data word, a corresponding bit of a comparison word, and an input magnitude signal;
- a word line for the group of MCAM cells;
- a plurality of data bit lines, one for each MCAM cell in the group of MCAM cells, for supplying bits of the data word to the MCAM cells;
- a plurality of comparison bit lines, one for each MCAM cell in the group of MCAM cells, for supplying bits of the comparison word to the MCAM cells, wherein the magnitude comparators of the MCAM cells are connected in a series arrangement, such that the output magnitude signal of an MCAM cell magnitude comparator in the series arrangement is provided as the input magnitude signal to a subsequent MCAM cell magnitude comparator in the series arrangement and, wherein the output magnitude signal is asserted if the comparison value is greater than the data value or if the comparison value is equal to the data value and the input magnitude signal is asserted.

* * * * *